United States Patent

Gervasi

[11] Patent Number: 5,948,083
[45] Date of Patent: Sep. 7, 1999

[54] SYSTEM AND METHOD FOR SELF-ADJUSTING DATA STROBE

[75] Inventor: William M. Gervasi, Campbell, Calif.

[73] Assignee: S3 Incorporated, Santa Clara, Calif.

[21] Appl. No.: 08/941,402

[22] Filed: Sep. 30, 1997

[51] Int. Cl.[6] .................................................. G06F 13/42
[52] U.S. Cl. ........................ 710/62; 710/65; 713/503; 375/334
[58] Field of Search ............................. 395/558; 375/334, 375/335, 336; 710/62, 65; 713/503

[56] References Cited

U.S. PATENT DOCUMENTS

| | | | |
|---|---|---|---|
| 5,469,547 | 11/1995 | Pawlowski | 395/285 |
| 5,548,732 | 8/1996 | Hoashi et al. | 395/285 |
| 5,633,899 | 5/1997 | Fiedler et al. | 375/376 |
| 5,684,837 | 11/1997 | Chen | 375/334 |
| 5,721,890 | 2/1998 | Langendorf | 395/558 |
| 5,737,589 | 4/1998 | Doi et al. | 395/558 |

FOREIGN PATENT DOCUMENTS 5-232827  9/1993  Japan .

Primary Examiner—Thomas C. Lee
Assistant Examiner—Mohamed Mashaal
Attorney, Agent, or Firm—Fenwick & West LLP

[57] ABSTRACT

A data capture system includes a data early latch, a data on-time latch, and a data late latch each coupled to receive an input data signal and a first, second, and third data strobe signal, respectively. When the respective data strobe signal is triggered the respective data latch captures, or latches, the input data signal at three intervals resulting in oversampled input data signals. The on-time data latch generates the latched data signal. The latched data signal is compared with the data early signal latched by the data early latch as well the data late signal latched by the data late latch. If the latched data signal and the data early signal are not equal, a delay controller increases the delays of the data strobe signals. If the latched data signal and the data late signal are not equal, the delay controller decreases the delays of the data strobe signals. If the latched data is equal to the data early signal no delay adjustment is made and likewise if the latched data is equal to the data late signal no delay adjustment is made. Further, the delay controller may include a counting circuit to adjust the data strobe signals at particular intervals. A method for adjusting data strobe signals for data capture is also disclosed.

7 Claims, 5 Drawing Sheets

SYSTEM AND METHOD FOR SELF-ADJUSTING DATA STROBE

BACKGROUND OF THE INVENTION

1. Field of the Invention

The present invention relates to data processing system interfaces, and more specifically, to data capture systems using data strobes to capture a data signal.

2. Description of the Related Art

The use of a data strobe to capture a data signal is known. Conventional data capture systems input data signals into a data latch and a data strobe signal triggers the data latch to capture the data at the edge of that data strobe signal. The data output from the data latch is a latched data signal.

FIG. 1 illustrates one problem associated with conventional data capture systems using a data strobe signal. A data capture system includes a data input line 110, a data strobe line 120, a data latch 130, and a data output line 140. The data input line 110 and the data strobe line 120 are coupled to inputs of the data latch 130. The data output line 140 is coupled to the output of the data latch 130.

The data latch 130 receives a data input signal 115a along the data input line 110 and a data strobe signal 125 along the data strobe line 120. Valid data is latched for output along the data output line 140 when the data strobe signal 125 is triggered within a window of opportunity, i.e., when the data strobe signal 125 captures valid data input signal 115a. No data is latched, however, when the data strobe signal 125 is triggered and the data is either too early 115b or too late 115c.

Conventional data capture systems as in FIG. 1 have a window to capture valid input data that may drift, either forward or backward, over time relative to when the data strobe signal 125 triggers the input latch to latch the input data signal 115a. An input data signal 115a that drifts forward is considered a late input data signal 115c and an input data signal 115a that drifts backward is considered an early input data signal 115a. The drift of the input data signal 115a may result in the capture of invalid input data because there is no data present to latch when the data strobe signal triggers the data latch.

To account for the data drift, conventional data capture systems constantly undergo a recalibration process. Generally, the recalibration process consists of timing the conventional data capture system at two points of failure and selecting a point inbetween as the point where the data strobe signal triggers the data latch to capture the input data. For the recalibration process, typically, a first point of failure is where data is late and a second point of failure is where the data is early. The constant timing of the failure points as a result of the recalibration process causes longer throughput delays that result in decreasing overall system performance.

Other conventional data capture systems use a programmable delay to account for data drift. Data capture systems using a programmable delay provide a data strobe signal to continually capture input data until invalid data is detected. If invalid data is received by the system, the data capture system is stopped, backed up, and retried to capture data input by providing a data strobe signal at another point.

A problem with the programmable delay is a decrease in system performance because of stopping and starting the data capture system every time data drifts. Moreover, such data capture systems often capture invalid input data even after invalid data is detected because the system may be unable to determine where to back up and retry the data capture process.

Another problem with a programmable delay is data inaccuracy. Data inaccuracy occurs because the data processing system is unaware of what data is to be received so that it is incapable of accurately stopping the data capture system and retrying the data capture process.

Some conventional data capture systems use no delays to account for data drift. These conventional data capture systems do not adjust the data strobe signal, but rather slow the data capture system. Slowing the data capture system increases the window of opportunity to capture input data making it large enough so that data does not drift outside that window of opportunity. Conventional data capture systems, such as programmable clock delay select systems, include complex circuit matrices and hardware logic to alter circuit routing to accommodate the necessary system delay to obtain a larger window of opportunity.

Such conventional systems, of course, decrease data capture speed. Further, in such conventional systems there is an increase in hardware costs resulting from the increased, and more complex, implementing hardware. Moreover, there is an increase in system testing costs as the data capture system must be tested against, and custom fit with, each and every associated hardware component that interacts with the data capture system.

Therefore, there is a need for a system and a method that (1) captures input data by strobing an input data signal only once, (2) provides an early warning detection system to adjust the data strobe points before data drifts outside a window of opportunity, (3) provides an early warning detection system to indicate when data is on the verge of failure, and (4) is flexible for use with a variety of associated hardware components that interact with data capture systems.

SUMMARY OF THE INVENTION

A system and a method of the present invention allows for the capture of an input data signal on a single strobe signal while providing an early warning detection system against input data drift and system failures. A data capture system of the present invention includes an input data line, a data early latch, a data on-time latch, a data late latch, a first data comparator, a second data comparator, a latched data line, a first comparator data line, a second comparator data line, a delay controller, a first delay block, a second delay block, a third delay block, and a data strobe line.

The input data line is coupled to each data latch. The early data latch and the data on-time latch are coupled to the first data comparator. The data on-time latch and the data late latch are coupled to the second data comparator. The first data comparator line is coupled to the first data comparator and the second data comparator line is coupled to the second data comparator. Both data comparator lines are coupled to the delay controller. The delay controller is coupled to each of the data delay blocks.

The data strobe line is coupled to the first delay block. The data on-time latch is coupled to the latched data line. Each of the delay blocks is coupled to the latches. Specifically, the first delay block is coupled to the data early latch, the second delay block is coupled to the data on-time latch, and the third delay block is coupled to the data late latch. In addition, the first delay block is coupled to the second delay block, which, in turn, is coupled to the third delay block.

When an input data signal is received along the input data line, it is passed on to each of the data latches. Each data latch outputs the data based upon a strobe signal received from the associated delay block. The result is oversampling the input data signal to determine whether the input data signal is early, on-time, or late. The data-capture system outputs the latched data along the latched data line.

It is noted that the data strobe signals from each of the delay blocks may be spaced at any interval and their timing is based on the data capture system frequency. The primary purpose of these strobe signals is to provide the timing for latching the input data. In a preferred embodiment, each data latch is able to latch the input data signal at some point where there is a valid data value.

The data early latch and the data late latch provide the early warning system for the data capture system. Specifically, the first data comparator compares the data from the data early latch with the data from the data on-time latch to determine whether the data is equal or not equal, i.e., whether both latches have or have not captured valid data. If the data is not equal, the delays are increased so that there is a greater delay in triggering the data strobe signals. No adjustment is made in triggering the data strobe signals if the compared data is found to be equal.

Similarly, the second data comparator compares the data from the data late latch with the data on-time latch. Again, the data is checked for data being equal or not equal. If the data is not equal, the delays are decreased so that there is a lesser delay in triggering the data strobe signals. Again, no adjustment is made in triggering the data strobe signals if the compared data is found to be equal.

The delay less or the delay more signals are forwarded to delay control, which determines how much to further delay each of the stages with respect to the delay block. These delays determine when the associated data strobe signals are triggered. Once again, it is noted that the result of the data compare may be zero, such that no delay is necessary to be introduced and the data strobe signals continue to be triggered at the same intervals.

The present invention offers an advantage of guaranteed data capture. The present invention also offers an advantage of increased system performance that, because of tighter design specifications, provides the ability to operate at higher frequencies. In addition, the present invention beneficially eliminates the requirement of programming a data capture system at particular intervals for adjustments to account for inconsistent chip voltages or chip temperatures that cause delays or data drift.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

DETAILED DESCRIPTION OF THE PREFERRED EMBODIMENTS

A preferred embodiment of the present invention will be described with reference to the Figures, where like reference numbers indicate identical or functionally similar elements. The present invention includes a data capture system that includes plurality of latches and a plurality of delay elements for adjusting when an input data signal is latched within the data capture system.

Figure 1:
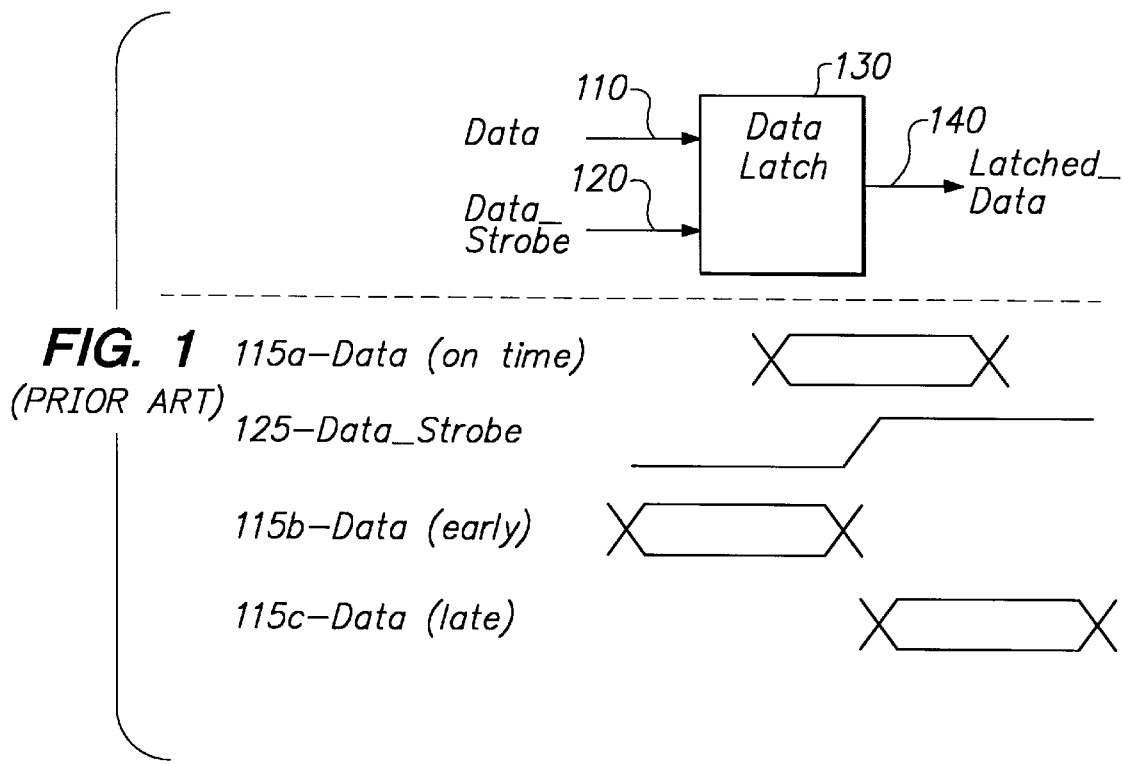
FIG. 1 is a prior art diagram of data passing through a conventional data capture system at different intervals.
Figure 2:
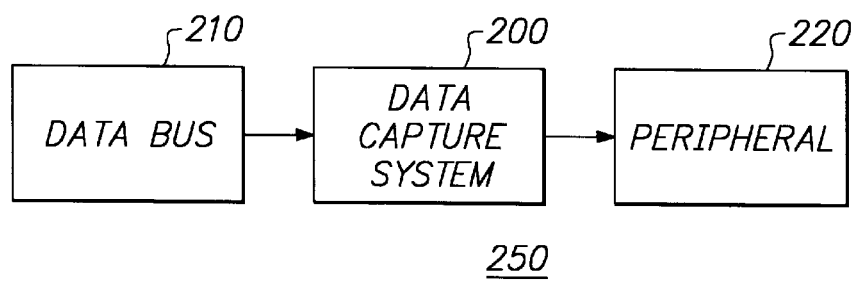
FIG. 2 is a block diagram of a data processing system, including a data capture system, in accordance with the present invention.

FIG. 2 is a block diagram of a data processing system 250 in accordance with the present invention. The data processing system 250 includes a data capture system 200, a data bus system 210, and a peripheral system 220. The data bus system 210 is coupled to one or more inputs of the data capture system 200 and the peripheral system 220 is coupled to one or more outputs of the data capture system 200. The data bus system 210 may be a conventional data bus system such as a personal computer system data bus, for example. The peripheral system 220 may be a conventional peripheral bus such as a computer memory, for example.

Generally, a data signal from the data bus system 210 is received as an input data signal by the data capture system 200. The data capture system captures, or latches, the input data signal. The latched data signal is then received by the peripheral system 220.

Figure 3:
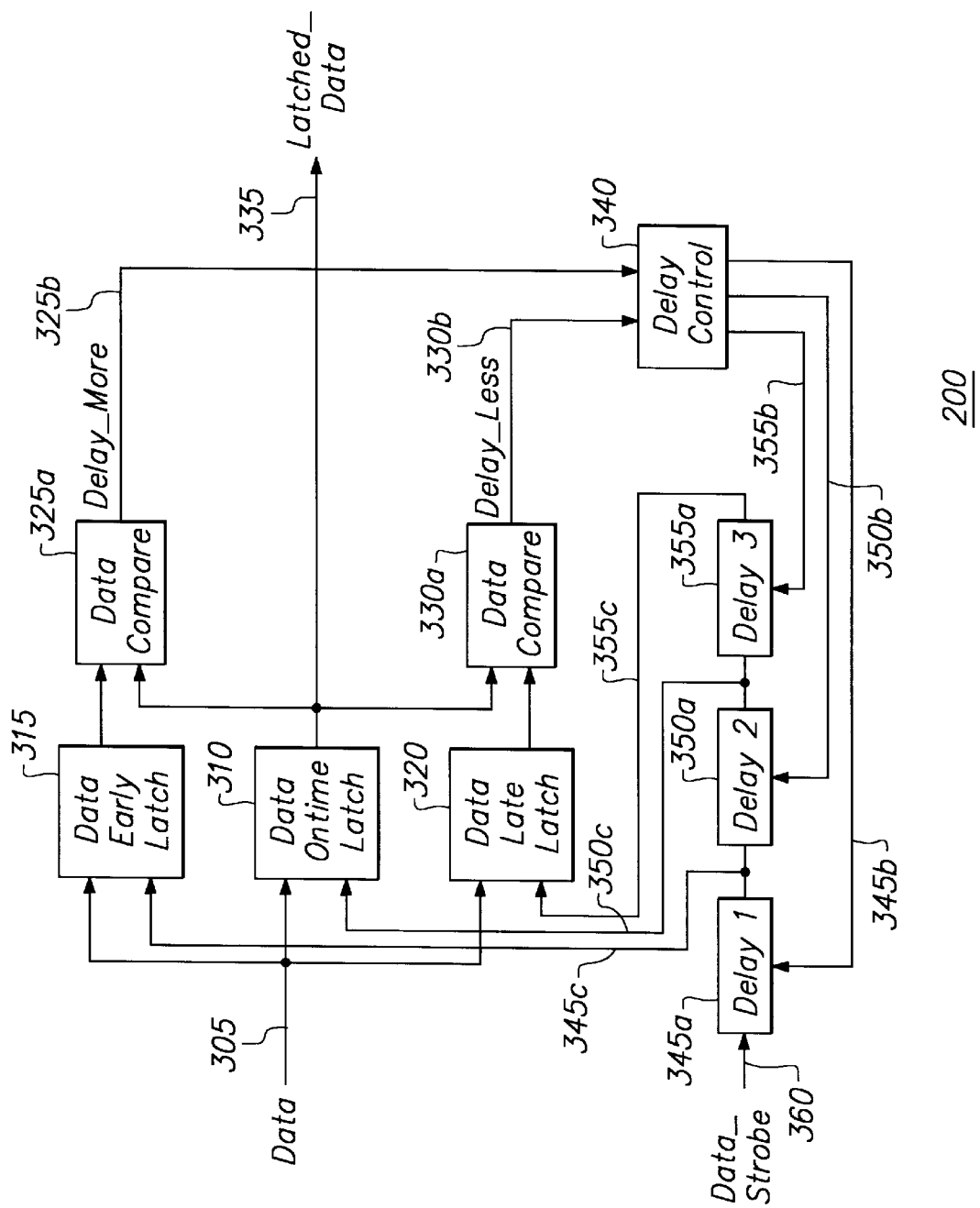
FIG. 3 is a block diagram of a data capture system in accordance with the present invention.

FIG. 3 is a block diagram of the data capture system 200 in accordance with the present invention. The data capture system 200 includes an input data line 305, a first or data on-time latch 310, a second or data early latch 315, a third or data late latch 320, a first data comparator 325a, a second data comparator 330a, a first comparator data line 325b, a second comparator data line 330b, a latched data line 335, a delay controller 340, a first delay block 345a, a second delay block 350a, a third delay block 355a, a first delay control line 345b, a second delay control line 350b, a third delay control line 355b, a first data strobe line 345c, a second data strobe line 350c, a third data strobe line 355c, and a data strobe source line 360.

The input data line 305 is coupled to each data latch 310, 315, 320. The data early latch 315 and the data on-time latch 310 are coupled to the first data comparator 325a. The data on-time latch 310 and the data late latch 320 are coupled to the second data comparator 330a. The data on-time latch 310 is also coupled to the latched data line 335. The first data comparator line 325b is coupled to the first data comparator 325a. The second data comparator line 330b is coupled to the second data comparator 330a. Both data comparator lines 325b, 330b are coupled to the delay controller 340. The delay controller 340 is coupled to each of the data delay blocks 345a, 350a, 355a through the respective delay control line 345b, 350b, 355b.

The data strobe source line 360 is coupled to the first delay block 345a. In addition, the first delay block 345a is coupled to the second delay block 350a that, in turn, is coupled to the third delay block 355a. Each delay block 345a, 350a, 355a is coupled to a data latch 315, 310, 320.

Specifically, the first delay block 345a is coupled to the data early latch 315 through the first data strobe line 345c. The second delay block 350a is coupled to the data on-time latch 310 through the second data strobe line 350c. The third delay block 355a is coupled to the data late latch 320 through the third data strobe line 355c.

Figures 4, 7:
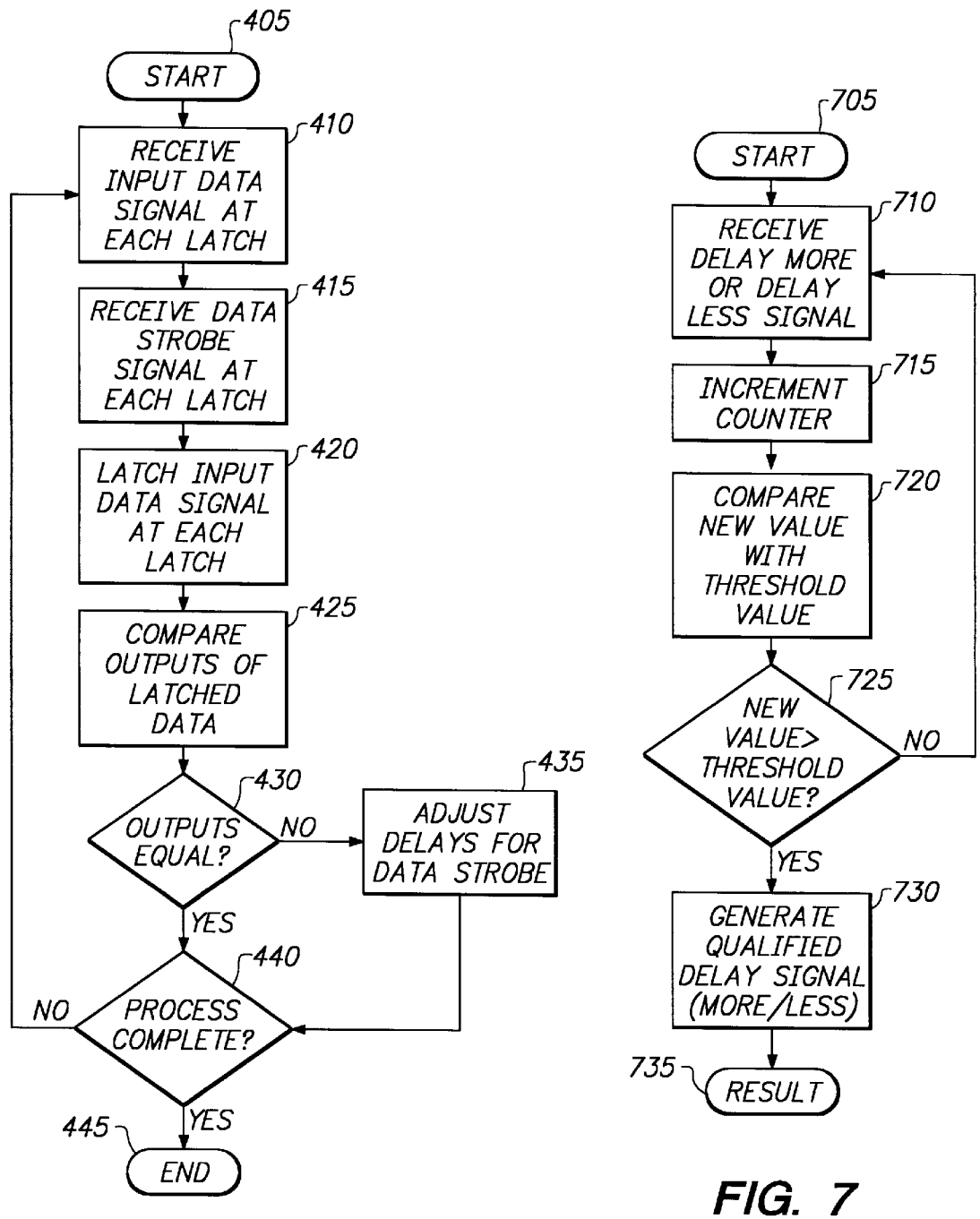
FIG. 4 is a flow diagram for monitoring input data captured in a data capture system in accordance with the present invention.
FIG. 7 is a flow diagram of operation of an embodiment of a delay controller in accordance with the present invention.
Figure 5:
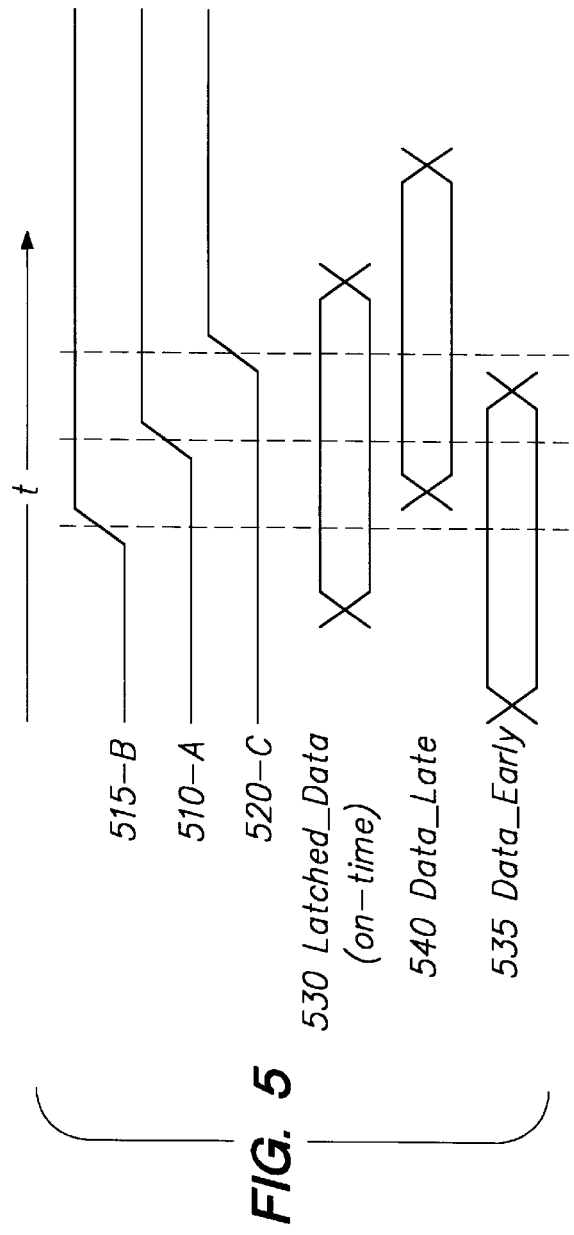
FIG. 5 is a timing diagram illustrating capture of an input data signal at various time intervals in the data capture system in accordance with the present invention.

Operation of the data capture system 200 may be described through FIGS. 4 and 5. Specifically, FIG. 4 is a flow diagram for monitoring input data captured in the data capture system 200 in accordance with the present invention. FIG. 5 is a timing diagram illustrating capture of an input data signal at various time intervals in the data capture system 200 in accordance with the present invention.

Once the data capture system 200 starts 405 operation, input data signals are received 410 along the data input line 305. It is noted that the input data signal may have a waveform similar to a latched data signal 530 as illustrated in FIG. 5, for example. As the input data signal is received 410 at each data latch 310, 315, 320, a particular data strobe signal is also received 415 at each latch.

Specifically, the first delay block 345a receives a single source data strobe signal along the data strobe source line 360. The single source data strobe signal is delayed by the first delay block 345a to generate a first data strobe signal 515. The data early latch 315 receives the first data strobe signal 515 along the first data strobe line 345c at one point in time.

The second delay block 350a also receives the first data strobe signal 515. The second delay block 350a generates a second data strobe signal 510. The data on-time latch 310 receives the second data strobe signal 510 along the second data strobe line 350c at another point in time.

The third delay block 355a also receives the second data strobe signal 510. The third delay block 355a generates a third data strobe signal 520. The data late latch 320 receives the third data strobe signal 520 along the third data strobe line 355c at yet another point in time.

As each data strobe signal 510, 515, 520 is received at the respective data latch 310, 315, 320, the input data signal is captured, or latched, by that data latch 310, 315, 320 when the data strobe signal 510, 515, 520 is triggered (e.g., the signal rises from logic "0" to logic "1" or, alternatively, vice versa). Each data latch 310, 315, 320 latches data where the data strobe signal 510, 515, 520 is triggered and where the data is valid, ie., where there is a valid value of the input data signal that is captured. Thus, the present invention oversamples the input data signal by using more than one data latch 310, 315, 320 to latch the input data signal at three separate occurrences in time or three separate locations along the input data signal.

FIG. 5 illustrates effects of data drift and a relationship between valid latched data and data that may be compromised. Each data latch 310, 315, 320 latches 420 the input data signal at different time intervals. If each data latch 310, 315, 320 latches a valid part of the input data signal, the latched data along the latched data line is considered to be an on-time latched data signal 530.

Further, the first data comparator 325a compares 425 the latched data signal from the data early latch 315 and the data on-time latch 310 and determines 430 whether the output latched signal from each of these data latches 315, 310 is equal. When both data latches 315, 310 capture valid data, such as the latched on-time data 530, the outputs are equal and no adjustment of the data strobe signals is necessary.

Similarly, the second data comparator 330a compares 425 the latched data signal from the data late latch 320 and the data on-time latch 310 and determines 430 whether the output latched signal from each data latch 320, 310 is equal. Again, when both latches 320, 310 capture valid data, such as the latched on-time data 530, their outputs are equal. Thus, the second data comparator 330a does not signal for an adjustment of the data strobe signals. With neither the first or the second data comparators 325a, 330a signaling for an adjustment of the data strobe signal, the process continues, as described below, by determining 440 whether more data is acquired by the data capture system 200.

If the data drifts late, for example a data late signal 540, each data latch 310, 315, 320 may not latch 420 the late data signal 540. For example, the data on-time latch 310 and the data late latch 320 latch 420 valid data of the late drifting data signal 540 when the data strobe signals 510, 520 to these data latches 310, 320 are triggered. When the second data comparator 330a compares 425 the output of the data on-time latch 310 and the data late latch 320, the output is determined 430 to be equal so that no adjustment 435 is made with respect to decreasing the delays of the data strobe signals 510, 515, 520.

When the data drifts late 540, however, the data early latch 315 does not latch 420 valid data when the data strobe signal 515 to this data latch 315 is triggered. Thus, when the first data comparator 325a compares 425 the output of the data early latch 315 with the output from the data on-time latch 310, the data capture system 200 determines 430 that the latched signals are mismatched or not equal. In response to the mismatched data signals, a delay more signal is output from the first data comparator 325a.

If the data drifts early, for example a data early signal 535, each data latch 310, 315, 320 may not latch 420 the early data signal 535. For example, the data on-time latch 310 and the data early latch 315 latch 420 valid data of the early drifting data signal 535 when the data strobe signals 510, 515 to these data latches 310, 315 are triggered. When the first data comparator 325a compares 425 the output of the data on-time latch 310 and the data early latch 315, the output is determined 430 to be equal so that no adjustment 435 is made to increase the delays of the data strobe signals 510, 515, 520.

When the data drifts early 535, however, the data late latch 320 does not latch 420 valid data when the data strobe signal 520 to this data latch 320 is triggered. Thus, when the second data comparator 330a compares 425 the output of the data late latch 320 with the output from the data on-time latch 310, the data capture system 200 determines 430 that the latched signals are mismatched or not equal. In response to the mismatched data signals, a delay less signal is output from the second data comparator 330a.

When the delay controller 340 receives a delay more or a delay less signal from the respective data comparators 325a, 330a, the delay controller 340 helps adjust 435 delays associated with the data strobe signals 510, 515, 520 accordingly. For example, if the delay controller 340 receives the delay more signal from the first data comparator 325a, the delay controller 340 adjusts 435 the delays for the data strobe signals 510, 515, 520 by generating a delay more control signal. Specifically, the delay more control signal is sent to each of the delay blocks 345a, 350a, 355a along the respective delay control line 345b, 350b, 355b. Upon receiving a delay more control signal from the delay controller 340, each delay block 345a, 350a, 355a increases the delays between successive triggers of the data strobe signal 515, 510, 520 output from that delay block 345a, 350a, 355a.

Similarly, if the delay controller 340 receives the delay less signal from the second data comparator 330a, the delay controller 340 adjusts 435 the delays for the data strobe signal by generating a delay less control signal. Specifically, the delay less control signal is sent to each of the delay blocks 345a, 350a, 355a along the respective delay control line 345b, 350b, 355b. Upon receiving a delay less control signal from the delay controller 340, each delay block 345a, 350a, 355a decreases the delays between successive triggers of the data strobe signals 515, 510, 520 output from that delay block 345a, 350a, 355a.

After receiving the latched data signal, the data capture system 200 may have completed its data acquisition process. If the data capture system 200 determines 440 that the process is complete, it may end operation 445.

If, however, the data capture system continues to acquire data, the process continues by continuing to receive 410 the input data signal at each data latch 310, 315, 320. If the delay controller 340 adjusted the delays at each delay block 345a, 350a, 355a, then the received data strobe signal 510, 515, 520 at each data latch will be appropriately triggered earlier or later based on the delays introduced. Again, the data capture system will latch 420 the input data signal at each data latch 310, 315, 320, compare 425 the data signals output from each data latch 310, 315, 320, determine whether the latched data signal at the early and late data signals are equal, and appropriately adjust the delays for the data strobe signals derived from the single source data strobe signal.

The present invention advantageously oversamples the input data signal to virtually guarantee data capture. Oversampling the input data signal allows for beneficially monitoring the input data signal as a data strobe signal is triggered at various intervals when latching the input data signal. Therefore, the present invention is able to adjust the data strobe signals 510, 515, 520, that are derived from a single source data strobe signal, before a data capture failure occurs, thereby, virtually guaranteeing data capture.

The present invention also provides an early correction system against data capture failure. The present invention tracks drifts of the input data signal relative to the data strobe signals 510, 515, 520 so that the data strobe signals 510, 515, 520 may be adjusted before there is a data capture failure, rather than address the data capture failure after a data failure has already occurred. That is, the present invention allows for continuous data capture even when the input data signal begins to drift because the present invention advantageously corrects, or adjusts, the data strobe signals 510, 515, 520 before data capture failure occurs.

The present invention also allows for operation within data processing systems having more stringent specifications, for example, operating at higher frequencies or higher temperatures. Thus, the present invention can operate to capture data at higher frequencies without increasing the number of errors. Moreover, the present invention advantageously operates at higher frequencies even when system temperatures increase. Further overall system efficiency increases because of virtually guaranteed data capture when the input data signal is first received.

Figure 6A:
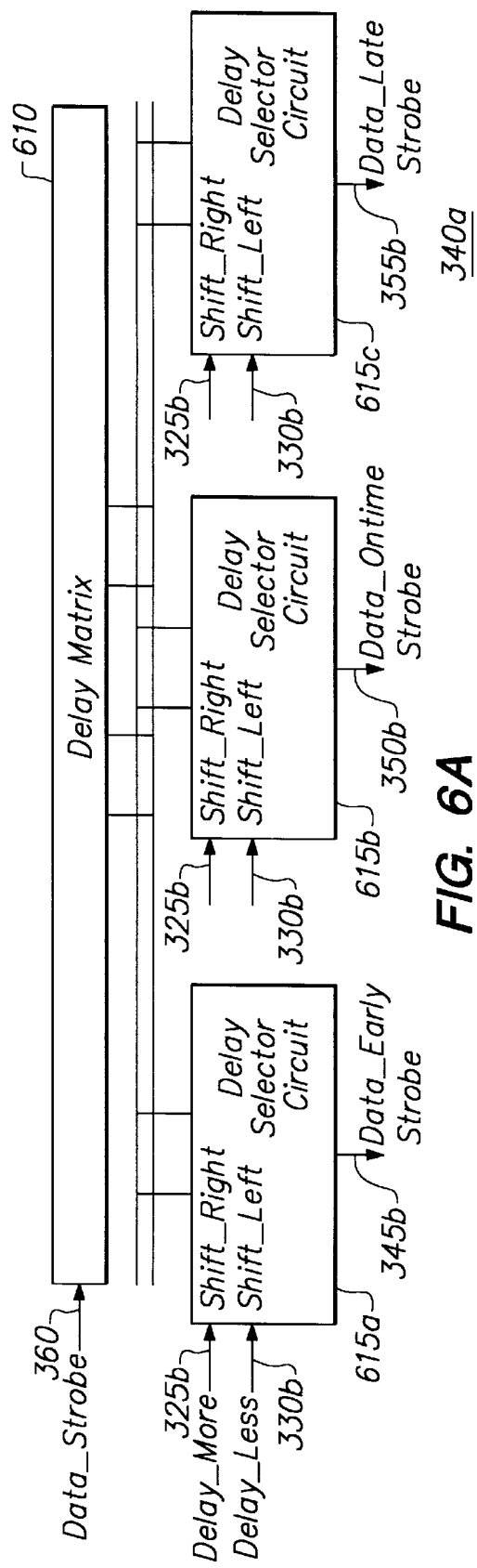
FIGS. 6a, 6b, and 6c are block diagrams of three embodiments of a delay controller in accordance with the present invention.
Figure 6B:
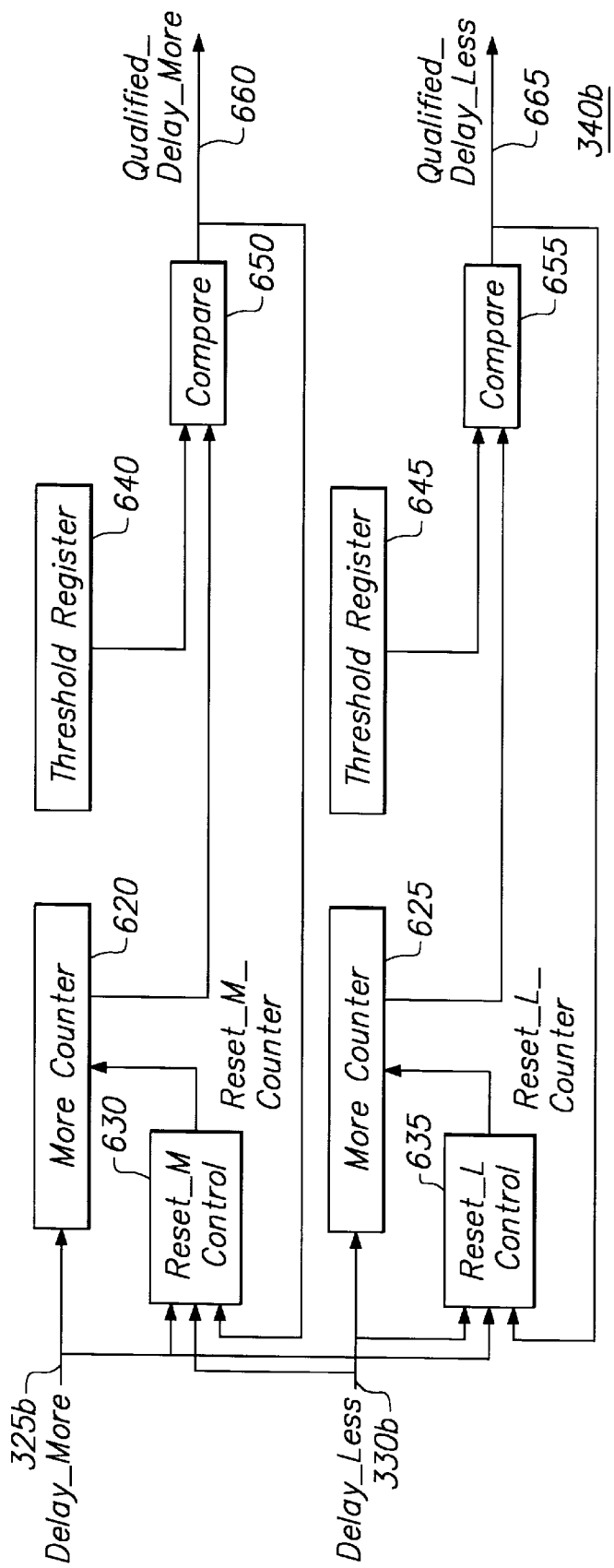
Figure 6C:
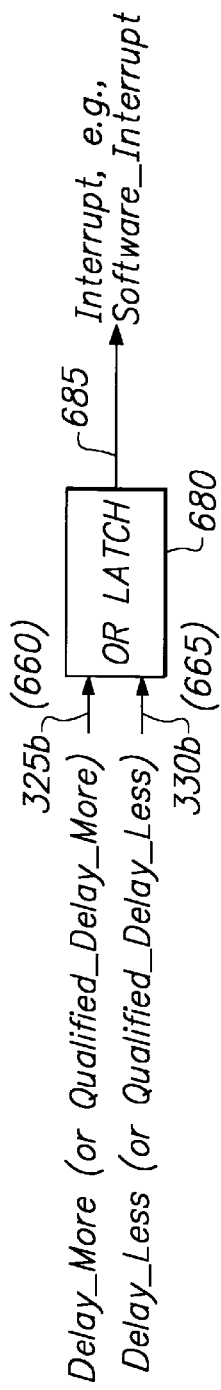

FIGS. 6a, 6b, and 6c are block diagrams of three embodiments 340a, 340b, 340c of a delay controller 340 in accordance with the present invention. Each embodiment of the delay controller 340 is functionally equivalent with respect to providing a mechanism that adjusts the delays of a data strobe subsystem within the data capture system 200 that generates multiple data strobe signals from a single source data strobe.

FIG. 6a illustrates a first embodiment of a delay controller 340a that includes a delay matrix 610, a first delay selector circuit 615a, a second delay selector circuit 615b, and a third delay selector circuit 615c. The delay matrix 610 is coupled to the data strobe signal line 360. Each delay selector circuit 615a, 615b, 615c is coupled to the delay matrix 610. Further, each delay selector circuit 615a, 615b, 615c is coupled to the first data comparator line 325b and the second data comparator line 330b.

The delay matrix 610 receives the data strobe signal from the data strobe source along the data strobe source line 360. The delay matrix 360 generates any number of delayed versions of the source data strobe signal so that the delay selector circuits 615a, 615b, 615c may choose from a number of outputs to select the proper delays. In a preferred embodiment there are at least five delays. The first delay selector circuit 615a receives the delay more signal or delay less signal from along the first data comparator line 325b or the second data comparator line 330b, respectively.

If a delay more signal is received by the data selector circuits 615a, 615b, 615c, each data selector circuit 615a, 615b, 615c generates a shift right signal that is used to increase the delays of the data strobe signals. If a delay less signal is received by the data selector circuits 615a, 615b, 615c, each data selector circuit 615a, 615b, 615c generates a shift left signal that is used to decrease the delays of the data strobe signals. Thus, the delay controller 340a provides a simple, low cost, clock adjusting circuit that allows for robust data capture capability.

FIG. 6b illustrates a second embodiment of a delay controller 340b that includes a first counter 620, a second counter 625, a first reset controller 630, a second reset controller 635, a first threshold register 640, a second threshold register 645, a first comparator 650, a second comparator 655, a qualified delay more signal line 660, and a qualified delay less signal line 665. The first data comparator line 325b is coupled to the first counter 620, the first reset controller 630, and the second reset controller 635. The second data comparator line 330b is coupled to the second counter 625, the first reset controller 630, and the second reset controller 635.

The first reset controller 630 is coupled to the first counter 620. The first counter 620 and the first threshold register 640 are coupled to the first comparator 650. The first comparator 650 is coupled to the first reset controller 630 and the qualified delay more signal line 660. Similarly, the second reset controller 635 is coupled to the second counter 625. The second counter 625 and the second threshold register 645 are coupled to the second comparator 655. The second comparator 655 is coupled to the second reset controller 635 and the qualified delay less signal line 665.

The first counter 620 may be set to increment by a value of x, where x is any numerical value. The value of x may be predetermined or preprogrammed. Further, the first threshold register 640 is also previously set to y, where y is any numerical value. The value of y may be predetermined or preprogrammed. The first reset controller 630 resets the first counter 620 if a compare is detected from the first comparator 650. The first reset controller 630 also resets the first counter 620 if a compare is detected, i.e., a logic false generated by the first data comparator 325a when the latched data from the on-time latch 310 and the data early latch 315 is equal.

Similarly, the second counter 625 may be set to increment by a value of m, where m is any numerical value. The value of m may be predetermined or preprogrammed. Further, the second threshold register 645 is also previously set to n, where n is any numerical value. The value of n may be predetermined or preprogrammed. The second reset controller 635 resets the second counter 625 if a compare is detected from the second comparator 655. The second reset controller 635 also resets the second counter 625 if a compare is detected, i.e., a logic false generated by the second data comparator 330a when the latched data from the on-time latch 310 and the data late latch 320 is equal.

FIG. 7 is a flow diagram illustrating operation of the second embodiment of the delay controller 340b in accordance with the present invention. When the delay controller 340b receives 710 a delay more signal, the delay more signal is input to the first counter 620 and the first reset controller 630. The first counter 620 increments 715 the value within the first counter 620 by x and outputs a new value to the first comparator 650. The first comparator 650 compares 720 the new value with the value received from the first threshold register 640.

If the delay counter 340b determines 725 that the new value from the first counter 620 exceeds the value of the first threshold register 640, the first comparator 650 generates 730 a qualified delay more signal that is output 735 to the delay blocks 345a, 350a, 355a. The qualified delay more signal is a signal that is used to increase the delays of the data strobe signals 510, 515, 520, but is qualified on being generated based on exceeding the threshold value set in the first threshold register 640. If the delay controller 340b determines 725 that the new value from the first counter 620 does not exceed the value set in the first threshold register 640 the delay controller 340b continues the process by receiving 710 the next delay more signal until the threshold value is exceeded.

Similarly, when the delay controller 340b receives 710 a delay less signal, the delay less signal is input to the second counter 625 and the second reset controller 635. The second counter 625 increments 715 the value within the second counter 625 by m and outputs a new value to the second comparator 655. The second comparator 655 compares 720 the new value with the value received from the second threshold register 645.

If the delay controller 340b determines 725 that the new value from the second counter 625 exceeds the value of the second threshold register 645, the second comparator 655 generates 730 a qualified delay less signal that is output 735 to the delay blocks 345a, 350a, 355a. The qualified delay less signal is a signal that is used to decrease the delays of the data strobe signals 510, 515, 520, but is qualified on being generated based on exceeding the threshold value set in the second threshold register 645. If the delay controller 340b determines 725 that the new value from the second counter 625 does not exceed the value set in the second threshold register 645 the delay controller 340b continues the process by receiving 710 the next delay less signal until the threshold value is exceeded.

The first and the second counters 620, 625 described in the second embodiment of the delay controller 340b provide added flexibility in adjusting the data strobe signals 510, 515, 520. The counters 620, 625 may count the number of times a delay more or delay less signal is received before adjusting the data strobe signals 510, 515, 520 to beneficially discern between the need for resetting the data strobe signals 510, 515, 520 verses a single occurrence of random noise, for example. Further, the counters 620, 625 provide a data integrity detection system that tracks the number of times the threshold value is exceeded so that if it is exceeded too often data integrity may soon be compromised.

FIG. 6c illustrates a third embodiment of a delay controller 640c that includes a logic OR latch 680 and an OR latch output line 685. The third embodiment of the delay controller 640c may be used in conjunction with either or both of the first embodiment or/and the second embodiment of the delay controller 640a, 640b. The OR latch 680 is coupled to receive a delay more signal and a delay less signal or a qualified delay more or a qualified delay less signal.

The OR latch 680 generates an interrupt signal along the OR latch output line 685. In one embodiment, the interrupt signal is received by an external device, a processor for example. Once a processor accepts the interrupt, the software can take some action. For example, the software can run a diagnostic test on the circuit, implement large scale counters beyond that which the hardware can implement, provide an early warning when excessive adjustments to the data strobe signals have been detected (may indicate pending failure), and lower the operating frequency of the interface to reduce the need for adjustments to the data strobe signals.

While particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. A data capture system for latching an input data signal, comprising:

a first data latch, coupled to receive an input data signal and a first data strobe signal, for generating a first latched data signal;

a second data latch, coupled to receive the input data signal and a second data strobe signal, for generating a second latched data signal;

a third data latch, coupled to receive the input data signal and a third data strobe signal, for generating a third latched data signal;

a first data comparator, coupled to receive the first latched data signal and the second latched data signal, for generating a delay more signal in response to the first latched data signal and the second latched data signal being not equal;

a second data comparator, coupled to receive the first latched data signal and the third latched data signal, for generating a delay less signal in response to the first latched data signal and the third latched data signal being not equal;

a delay controller, coupled to receive at least one of the delay more signal or the delay less signal, for generating an adjusting signal to adjust the delays of each data strobe signal;

a first delay element, coupled to receive a source data strobe signal and the adjusting signal from the delay controller for generating the second data strobe signal;

a second delay element, coupled to receive the second data strobe signal and the adjusting signal from the delay controller, for generating the first data strobe signal; and a third delay element, coupled to receive the first data strobe signal and the adjusting signal from the delay controller, for generating the third data strobe signal.

2. The data capture system in claim 1, wherein the delay controller further comprises:

a threshold register for storing a threshold value;

a counter, coupled to receive the delay more signal or the delay less signal, for incrementing a counter value upon receiving the delay more signal or the delay less signal; and a comparator, coupled to receive the threshold value and the counter value, for comparing the threshold value and the counter value and generating a qualified delay more or delay less signal in response to the counter value exceeding the threshold value.

3. The data capture system in claim 2, wherein the delay controller further comprises an OR latch for generating a software interrupt signal in response to receiving the qualified delay more signal or the qualified delay less signal.

4. The data capture system in claim 1, wherein the delay controller further comprises an OR latch for generating a software interrupt signal in response to receiving the delay more signal or the delay less signal.

5. The data capture system in claim 1, wherein the delay controller further comprises:

a delay matrix, coupled to receive the source data strobe signal, the delay matrix disposed to generate at least one delayed version of the source data strobe signal;

a first delay selector circuit, coupled to receive the delay more signal and the delay less signal and coupled to the delay matrix;

a second delay selector circuit, coupled to receive the delay more signal and the delay less signal and coupled to the delay matrix; and a third delay selector circuit, coupled to receive the delay more signal and the delay less signal and coupled to the delay matrix, wherein each delay selector circuit is disposed to shift the source data strobe from the delay matrix in a first direction to increase delay in the adjustment signal in response to the input data signal drifting early and disposed to shift the source data strobe from the delay matrix in a second direction to decrease delay in the adjustment signal in response to the input data signal drifting late.

6. In a data capture system, a method for ensuring capture of an input data signal, comprising:

receiving an input data signal at a first latch, a second latch, and a third latch;

receiving a first data strobe signal at the first latch, a second data strobe signal at the second latch, and a third data strobe signal at the third latch;

latching the input data signal at each latch in response to receiving the respective data strobe signal at that latch;

comparing the latched data from the first latch and the second latch to determine if the latched data is equal;

adjusting each data strobe signal individually to delay more in response to the latched data from the first latch and the second latch being not equal;

comparing the latched data from the second latch and the third latch to determine if the latched data is equal; and adjusting each data strobe signal individually to delay less in response to the latched data from the second latch and the third latch being not equal.

7. The method for ensuring capture of an input data signal in claim 6, wherein the adjusting each data strobe signal steps further comprise:

receiving the delay more signal or the delay less signal;

incrementing a counter value in response to receiving the delay more signal or the delay less signal;

comparing the counter value with a first threshold value in response to receiving a delay more signal and with a second threshold value in response to receiving a delay less signal;

generating a qualified delay more signal in response to the counter value incremented by the delay more signal exceeding the first threshold value; and generating a qualified delay less signal in response to the counter value incremented by the delay less signal exceeding the second threshold value.

* * * * *